United States Patent [19]

Negami et al.

[11] Patent Number: 5,474,622
[45] Date of Patent: Dec. 12, 1995

[54] SOLAR CELL HAVING CHALCOPYRITE SEMICONDUCTOR FILM

[75] Inventors: Takayuki Negami, Katano; Mikihiko Nishitani, Nara; Shigemi Kohiki, Osaka; Takahiro Wada, Katano, all of Japan

[73] Assignee: Matsushita Electric Industrial Co., Ltd., Osaka, Japan

[21] Appl. No.: 316,271

[22] Filed: Sep. 30, 1994

Related U.S. Application Data

[62] Division of Ser. No. 195,948, Feb. 14, 1994, Pat. No. 5,389,572.

[30] Foreign Application Priority Data

Feb. 15, 1993 [JP] Japan ................................ 5-025287

[51] Int. Cl.$^6$ .......................... H01L 31/04; H01L 31/032
[52] U.S. Cl. .................................... 136/265; 136/264
[58] Field of Search .................................. 136/264, 265

[56] References Cited

U.S. PATENT DOCUMENTS

| | | | |
|---|---|---|---|
| 4,004,342 | 1/1977 | Park et al. | 437/3 |
| 5,078,804 | 1/1992 | Chen et al. | 437/5 |
| 5,286,306 | 2/1994 | Menezes | 136/264 |
| 5,422,304 | 6/1995 | Kohiki et al. | 437/105 |

FOREIGN PATENT DOCUMENTS

| | | |
|---|---|---|
| 0360403 | 3/1990 | European Pat. Off. . |
| 2270381 | 11/1990 | Japan . |
| 4324647 | 11/1992 | Japan . |

*Primary Examiner*—Aaron Weisstuch
*Attorney, Agent, or Firm*—Panitch Schwarze Jacobs & Nadel

[57] ABSTRACT

A solar cell device includes an absorber layer or heterojunction-forming layer which comprises a I-III-VI$_2$ chalcopyrite semiconductor film containing a Group VIIA element as a dopant. The semiconductor film can be made by depositing a I-III-VI$_2$ chalcopyrite compound film onto a substrate while evaporating onto the substrate a Group VIIA element to obtain a I-III-VI$_2$ chalcopyrite compound film containing a Group VIIA element therein as a dopant.

1 Claim, 8 Drawing Sheets

SOLAR CELL HAVING CHALCOPYRITE SEMICONDUCTOR FILM

This is a divisional of U.S. patent application Ser. No. 08/195,948, filed Feb. 14, 1994, now U.S. Pat. No. 5,389,572.

BACKGROUND OF THE INVENTION

1. Field of the Invention

The present invention relates to a chalcopyrite structure semiconductor thin film containing a specific dopant and a process of producing the same.

2. Description of the Related Art

The chalcopyrite structure semiconductor is a material useful for constituting light-emitting devices and solar cells, because its forbidden band can be wide from a visual region to an infrared ray region and it has a large optical absorption coefficient due to the constituent elements. It is indispensable to produce a p-n junction in manufacturing the solar cells or light-emitting devices. For controlling p-n conductivity type of the chalcopyrite thin film, a method of changing the composition ratio between a Group I element and a Group III element or between a Group II element and a Group IV element which are the constituent elements of chalcopyrite compounds has been used conventionally. For example, in the case of $CuInSe_2$ thin film, n-type conductivity is formed when the proportion of the Group III element Cu is less than that of the Group I element In, and in the opposite case p-type conductivity is formed. In these cases, a problem is encountered in that many lattice defects occur due to deviations in the composition ratio. There are also such problems as deposition of excessive amounts of components or the appearance of an impurity phase other than the chalcopyrite structure. R. Noufi et al., also report that, it is difficult to control carrier concentration and resistivity by changing the composition ratio (Appl. Phys. Lett., 45 (1984) p.688). Particularly, most of the chalcopyrite semiconductor thin films which take on n-type conductivity by deviation of the composition ratio shows a high resistance, and thus a low resistance film is not obtainable.

In fabricating the p-n junction by using the chalcopyrite thin film produced by the prior art, such inconveniences as lattice defects and depositions of excess components owing to deviations of composition ratio, or the formation of an impurity phase other than the chalcopyrite-structure appears as mentioned before. As a consequence, the electrical and optical characteristics of the chalcopyrite thin film are deteriorated. Thus, when devices having a p-n junction are manufactured by using the chalcopyrite thin film produced by the prior art, the efficiency of the devices is inferior due to the deterioration of electrical and optical characteristics. For example, because of an increase of carrier recombination centers due to the lattice defects and the impurity phase, the open-circuit voltage of the solar cell decreases and also the quantum efficiency of semiconductor laser decreases.

When an n-type high resistance film is used, in the solar cells the short-circuit current decreases, and in the light-emitting devices the carrier injection efficiency reduces. Thus, the conversion efficiency of the solar cells and the luminous efficiency of the light-emitting devices are deteriorated.

Moreover, in the solar cells, the depletion layer of the p-n junction must be broadened to convert incident light efficiently into electrical energy. Thus it is necessary to control the carrier concentration.

SUMMARY OF THE INVENTION

The present invention provides a chalcopyrite structure semiconductor film comprising a Group $I-III-VI_2$ chalcopyrite compound containing a Group VIIA element as a dopant.

The present invention further relates to a process of producing a chalcopyrite thin film, whereby the conventional problems are solved, constituent element composition is in a stoichiometric ratio, and electrical characteristics such as p-n conductivity types and carrier concentration are controlled.

A first process of producing the chalcopyrite structure semiconductor film of the present invention comprises:

depositing a $I-III-VI_2$ chalcopyrite compound film on a substrate while evaporating onto the substrate a Group VIIA element, to obtain a $I-III-VI_2$ chalcopyrite compound film containing the Group VIIA element therein as a dopant.

A second process of producing the chalcopyrite structure semiconductor film of the present invention comprises the steps of:

depositing a $I-III-VI_2$ chalcopyrite compound film on a substrate, and heat treating the deposited chalcopyrite compound film in an atmosphere containing a vapor of a Group VIIA element or a compound thereof to obtain a $I-III-VI_2$ chalcopyrite compound film containing the Group VIIA element therein as a dopant.

In a preferred embodiment, the process further comprises the step of heat treating the chalcopyrite compound film containing the Group VIIA element as a dopant, preferably in an atmosphere containing a gas selected from the group consisting hydrogen, nitrogen, oxygen, helium, and argon. The preferable temperature of the heat treating lies in the range of from 200° C. to 400° C.

In another preferred embodiment, the process further comprises the step of heat treating the chalcopyrite compound film containing the Group VIIA element as a dopant in an atmosphere containing a vapor of the Group VI element.

In still another embodiment, the heat treating of the deposited chalcopyrite compound film in the atmosphere containing the vapor of the Group VIIA element or a compound thereof is carried out under a vacuum of $10^{-9}$ Torr to $10^{-2}$ Torr.

A third process of producing the chalcopyrite structure semiconductor film of the present invention comprises the steps of:

depositing a $I-III-VI_2$ chalcopyrite compound film on a substrate, and heat treating the deposited chalcopyrite compound film in an atmosphere containing a gaseous compound of a Group VIIA element to obtain a chalcopyrite compound film containing the Group VIIA element therein as a dopant.

A fourth process of producing the chalcopyrite semiconductor film of the present invention comprises the steps of:

depositing a film comprising a Group I element and a Group III element on a substrate, and heat treating the film in an atmosphere containing a vapor of a Group VI element or a gaseous compound thereof and a gaseous compound of a Group VIIA element to obtain a $I-III-VI_2$ chalcopyrite compound containing the Group VIIA element as a dopant.

The present invention further provides a solar cell whose absorber layer or heterojunction forming layer comprises a I-III-VI$_2$ chalcopyrite semiconductor film containing a Group VIIA element as a dopant.

The present invention also provides a light-emitting device whose active layer or clad layer comprises a I-III-VI$_2$ chalcopyrite semiconductor film containing a Group VIIA element as a dopant.

DETAILED DESCRIPTION OF THE INVENTION

Figure 1:
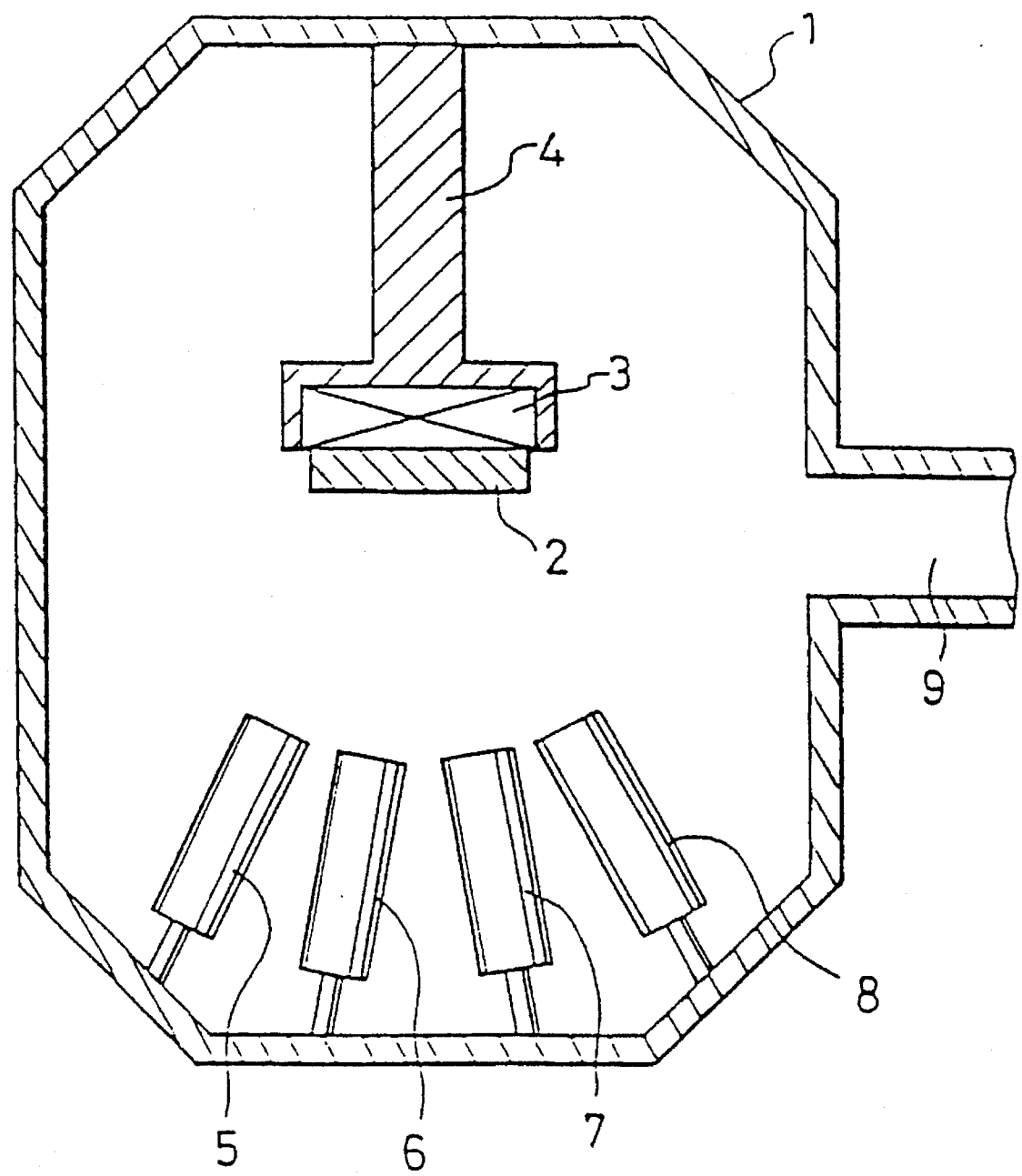
FIG. 1 is a longitudinal sectional view showing a schematic configuration of an apparatus for obtaining a I-III-VI$_2$ chalcopyrite structure semiconductor thin film doped with a Group VIIA element in one embodiment of the present invention.

The present invention is directed to a Group I-III-VI$_2$ chalcopyrite structure semiconductor film containing a Group VIIA element as a dopant, and to methods for producing the same.

The advantageous I-III-VI$_2$ chalcopyrite structure semiconductor thin film of the present invention is obtained, by containing the Group VIIA element as a dopant, whereby the composition of the constituent elements is in a stoichiometric ratio, and the electrical characteristics such as p-n conductivity types and carrier concentrations are controlled.

According to the first production process of the present invention, by simultaneously evaporating the Group VIIA element or a compound thereof onto the substrate during depositing the Group I-III-VI$_2$ chalcopyrite structure semiconductor thin film on a substrate by evaporation, sputtering or the like, the Group VI element in the deposited chalcopyrite structure is partly substituted by the Group VIIA element.

According to the second and third production processes of the present invention, by heat treating the deposited I-III-VI$_2$ thin film in an atmosphere containing a vapor of the Group VIIA element or a compound thereof, or an atmosphere containing a gaseous compound of the Group VIIA element under a vacuum or a gas atmosphere, the Group VI element in the I-III-VI$_2$ chalcopyrite is substituted by the Group VIIA element (hereinafter, the second and the third production processes are referred to as "diffusion process").

According to the fourth production process of the present invention, by heat treating a film comprising the Group I and Group III elements in an atmosphere containing a vapor of the Group VI element or a gaseous compound thereof and a gaseous compound of the Group VIIA element, the Group VIIA element is incorporated in the resultant I-III-VI$_2$ chalcopyrite film, and the Group VI element in the film is partly substituted by the Group VIIA element.

As mentioned above, the I-III-VI$_2$ chalcopyrite structure semiconductor thin film obtained by the present invention becomes a semiconductor film showing n-type conductivity in the presence of excess electrons caused by partial substitution of the Group VI element by the Group VIIA element.

The amount of the element (dopant) partly substituted for the main element is very small, usually 0.1 atomic % or less, and therefore, the composition ratio of the resultant chalcopyrite thin film can be kept in a stoichiometric ratio. Thus, there is no appearance of lattice defects and excess component depositions due to the deviation of composition ratio nor appearance of an impurity phase other than the chalcopyrite structure. Also, in such production processes, by controlling the evaporating rate of the Group VIIA dopant element or the compound thereof, or the flow rate of gaseous compound of the Group VIIA element, the carrier concentration or resistivity of the resultant film can be controlled. Thus, the degree of freedom of designing the solar cells or light-emitting devices increases, and the desired carrier concentrations or the like necessary for the devices can be obtained easily.

Since the substitution takes place from the surface of the chalcopyrite thin film when substituting the dopant for the main element by using the diffusion process, the Group VIIA element tends to concentrate near the surface, and the concentration inside the film becomes gradually lower as the depth increases. When such a distribution has occurred, for example, in the solar cells, an internal electric field is produced in the n-type semiconductor film, and minority carriers (in this case, positive holes) produced near the surface are accelerated inwardly, i.e. towards the p-n junction interface from the film surface. Therefore, carrier recombination in the n-type film decreases and a large amount of electric current can be obtained.

Moreover, by the heat treatment of the n-type chalcopyrite thin film obtained by the aforementioned process, the activation factor of the dopant (amount of electrons vs. amount of dopant) can be improved. That is, a low resistance n-type film can be obtained with a small amount of dopant, and deterioration of crystalline quality such as disturbance of the chalcopyrite structure due to excess impurities is eliminated. Moreover, the n-type chalcopyrite film formed by the diffusion process can be used in a process of optimizing the efficiency of devices such as solar cells, because the form of the distribution of the dopant can be controlled by the heat treatment temperature and time.

Since the n-type chalcopyrite thin film obtained by the aforementioned process has few lattice defects, deposition of excess components, or an impurity phase, the amount of carrier recombination centers decreases, and thus one can realize solar cells having a high conversion efficiency and light-emitting devices having a high luminous efficiency.

The range of appropriate temperature for heat treatment in the third process or the fourth process of producing the chalcopyrite structure semiconductor film is between 300° C. and 600°. Although the temperature of heat treatment for the chalcopyrite structure films may differ depending on their constituent elements, a film of high quality is not expected to be obtained with heat treatment at a temperature lower than 300°. And, when heat treatment is made at a temperature higher than 600° C., the film composition changes owing to desorption of a Group VI element, or Group III and VI elements from the film.

The Group I elements which are applicable to the present invention are, for instance, Cu and Ag.

The Group III elements which are applicable to the present invention are, for instance, Al, Ca, and In.

The Group VI elements which are applicable to the present invention are, for instance, S, Se, and Te. Further, as the gaseous compounds of the Group VI element which are applicable to the present invention, for instance, $H_2S$, $CS_2$, $H_2Se$, $(CH_3)_2Se$, $(C_2H_5)_2Se$, or the like are exemplified.

The Group VIIA elements which are applicable to the present invention are, for instance, F, Cl, and Br. Further, as the gaseous compounds of the Group VIIA elements, for instance, HCl, HF or the like are exemplified.

In the following, the embodiments of the present invention are described with reference to the drawings.

Embodiment 1

FIG. 1 shows a schematic configuration of an apparatus for obtaining a chalcopyrite structure semiconductor thin film.

In a vacuum chamber 1, a support 4 is provided for holding a substrate 2 for depositing a chalcopyrite thin film thereon and including heater 3 for heating the substrate 2. Moreover, in the chamber 1, a source 5 of Cu, a source 6 of In, and a source 7 of Se, which are the main constituent elements of chalcopyrite compound $CuInSe_2$, and a source 8 of a dopant including $InCl_3$ are provided.

An opening 9 is connected to an exhaust system. The source crucibles of Cu, In, and Se were heated in a vacuum of about $10^{-7}$ Torr respectively at 1140° C., 860° C., and 200° C. to evaporate the elements, and simultaneously, was evaporated from the source of $InCl_3$ to deposit a $CuInSe_2$:Cl (CIS:Cl) film on the substrate. Hereinafter, this production process is referred to as "simultaneous evaporating process". In this process, when $InCl_3$ is heated, it is decomposed and only Cl is evaporated at a temperature of about 300° C. or less. A glass plate partly covered by a ZnO film and an Au film was used as the substrate.

Figure 2:
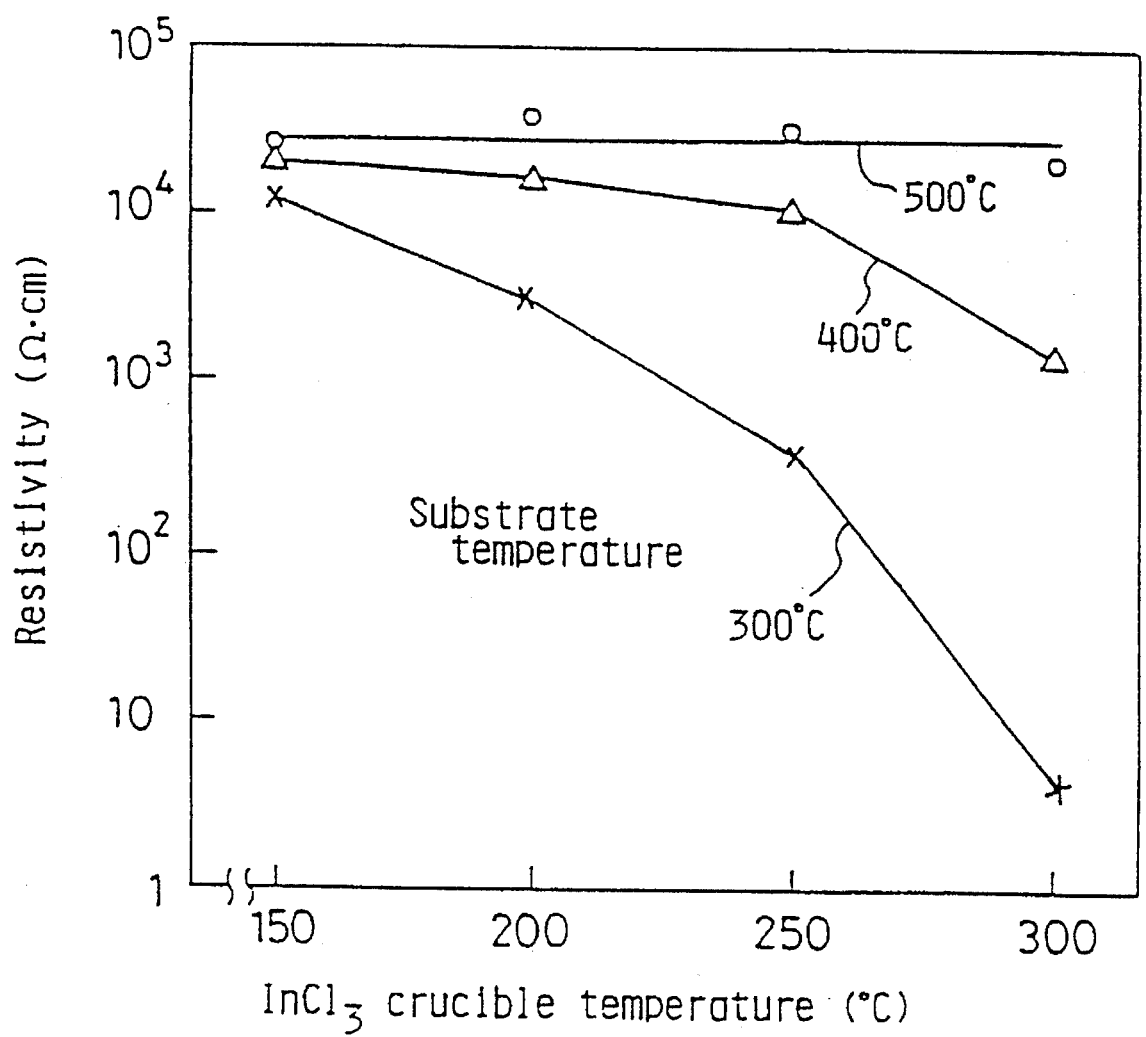
FIG. 2 shows the relationship between substrate temperature, InCl$_3$ crucible temperature, and resistivity of a CIS:Cl film obtained in embodiment 1 of the present invention.

FIG. 2 shows the relationship between the substrate temperature during film forming, $InCl_3$ crucible temperature, and resistivity of the resultant CIS:Cl film. The higher the $InCl_3$ crucible temperature is, the faster is the evaporating rate of Cl and the greater the deposition quantity on the substrate. The composition ratio Cu/In of the resultant film is within a range of from 0.95 to 1.00, and Se/(Cu+In) is within a range of from 1 to 1.02, and thus the stoichiometric composition ratio (Cu:In:Se=1:1:2) is substantially satisfied. All of the resultant films were n-type. When forming the film at the substrate temperature of 500° C., regardless of the $InCl_3$ crucible temperature, the resistivity of the resultant film was $10^4 \Omega$ cm or more. Since the resistivity of a $CuInSe_2$ (CIS) film of stoichiometric composition ratio without Cl is about $10^5$ to $10^4 \Omega$ cm, when forming the film at the substrate temperature of 500° C. it is understood that Cl hardly enters the film. When forming the film at the substrate temperature of 400° C., the film resistivity drops to $10^3 \Omega$ cm when the $InCl_3$ crucible temperature is kept at 300° C. On the contrary, when forming the film at the substrate temperature of 300° C., the film resistivity drops abruptly as the $InCl_3$ crucible temperature rises.

From the above facts, it is understood that Cl is effectively taken into the film at the substrate temperature of about 300° C. during film forming. When forming the film at the substrate temperature of 300° C., the film resistivity or the carrier concentration can be controlled by the $InCl_3$ crucible temperature. However, as a result of X-ray diffraction, it is understood, that, when forming the film on the glass and the Au film, the CIS:Cl film produced at the substrate temperature of 400° C. or higher forms a chalcopyrite structure, while the film produced at the substrate temperature of 300° C. does not form the chalcopyrite structure. Thus, this process is not suitable for forming the film on amorphous substrates such as glass plates and metal films. However, from analysis of an X-ray diffraction pattern, it is confirmed that the chalcopyrite structure is formed not only in the case of substrate temperature of 400° C. or higher, but even in the case of substrate temperature of 300° C., when forming the film on a ZnO film. Thus, the validity of this production process is dependent on the substrate being used, and therefore, this point should be noted.

The preferable substrate is a material having polycrystal structure, and amorphous materials or metals are not suitable. A semiconductor of a Group IV element, e.g., Si, a Group II–VI compound, e.g., CdS or an oxide, e.g., ITO (indium tin oxide), $SnO_2$ or $Al_2O_3$ is suitable for the substrate.

Embodiment 2

Description will now be made of an example of a production process, whereby the group VI element in the film is substituted by the group VIIA element, by heating the film while evaporating the group VIIA element after depositing a $I$-$III$-$VI_2$ chalcopyrite thin film. Hereinafter, this process is referred to as "vapor-phase diffusion process".

Using the same vacuum container as shown in FIG. 1, Cu, In. and Se are heated to the same temperature as in the aforementioned embodiment to produce a CIS film at a substrate temperature of 500° C. Then, the substrate temperature is fixed within a range of 200° to 400° C. while evaporating $InCl_3$ from the source in vacuum about $10^{-7}$ Torr to heat the CIS film.

Figure 3:
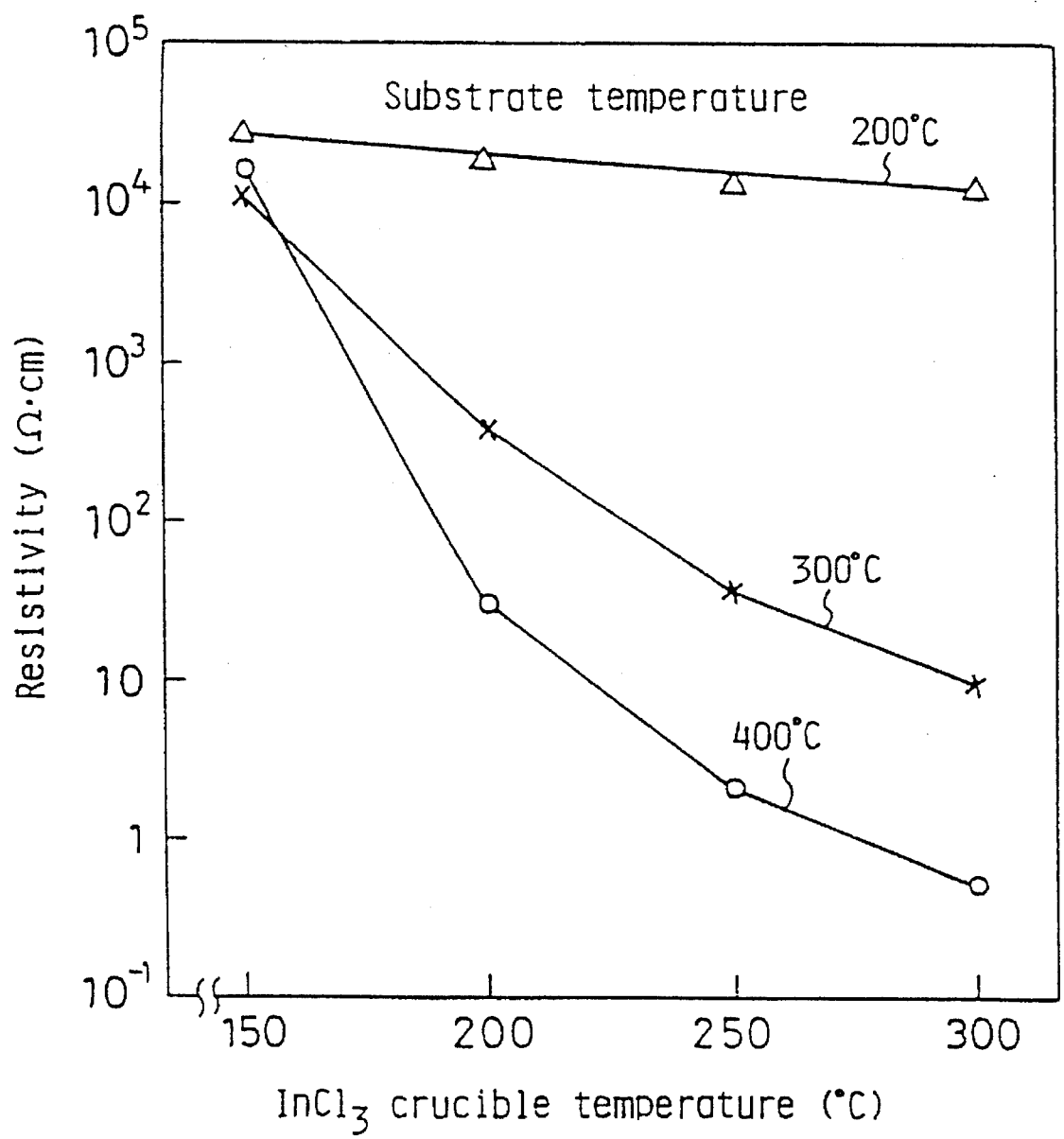
FIG. 3 shows the relationship between substrate temperature, InCl$_3$ crucible temperature at the time of heat treating a CIS film, and resistivity of the resultant CIS:Cl film in embodiment 2.

FIG. 3 shows the relationship between the substrate temperature, $InCl_3$ crucible temperature, and resistivity of the heat treated film. The heat treatment time is fixed at 30 minutes. Compositions of all of the heat treated films substantially satisfy the stoichiometric composition ratio, and show n-type conductivity. When the substrate temperature is 200° C., the change of film resistivity is small vs. changes in the $InCl_3$ crucible temperature, and at an $InCl_3$ crucible temperature of 150° C. it is not much different from the resistivity of about $10^4 \Omega$ cm of the CIS film without Cl. When the substrate temperature is 300° C., the resistivity drops abruptly as the $InCl_3$ crucible temperature rises, and at the $InCl_3$ crucible temperature of 300° C., the resistivity drops to about $10 \Omega$ cm. This value is lower by three orders of magnitude than the resistivity of the CIS film without Cl. From this fact, it is understood that the resistivity can be controlled by the InCl$_3$ crucible temperature.

The temperature range of the substrate for obtaining favorable results is 300° C. to 500° C..

Embodiment 3

Description will now be made of an example of a production process, whereby the group VI element in the film is substituted by the group VIIA element, by heating the I-III-VI$_2$ chalcopyrite thin film in a gaseous atmosphere containing the group VIIA element after being deposited on the substrate. Hereinafter, this process is referred to as "gas heat treatment process".

Figure 4:
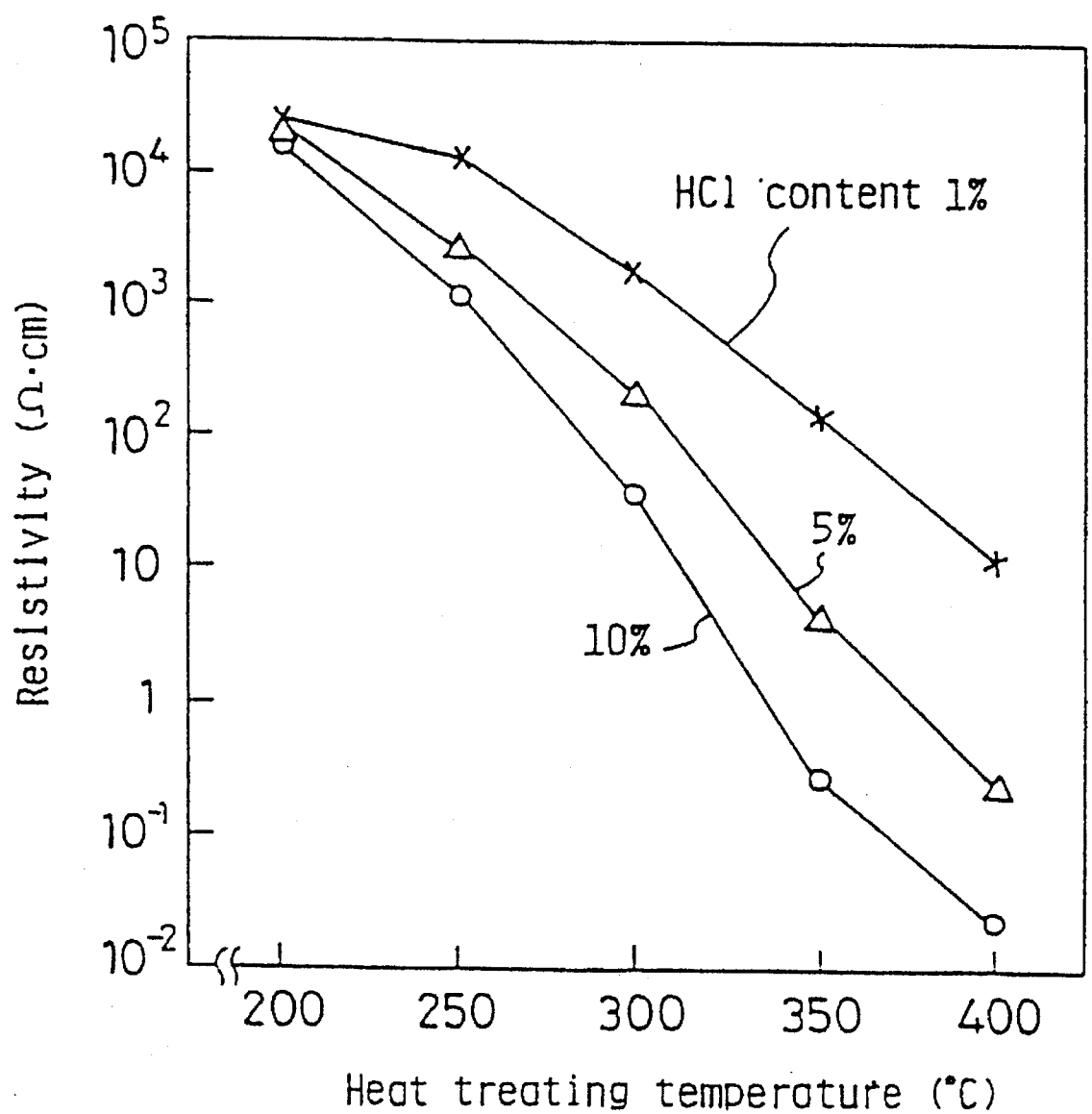
FIG. 4 shows the relationship between HCl content in an atmosphere, heat treatment temperature at the time of heat treating the CIS film, and resistivity of the resultant CIS:Cl film in embodiment 3.

A CIS film produced at a substrate temperature of 500° C. by the same process as the aforementioned embodiment was fed into a quartz tube, and heated while a gas mixture of HCl and N$_2$ was introduced to the quartz tube. The flow rate of the gas mixture was 200 ml/min., and the heat treatment time was one hour. FIG. 4 shows the relationship between the HCl gas content in the gas mixture, heat treatment temperature, and resistivity of the heat treated CIS film. All of the resultant films show n-type conductivity. Regardless of the HCl content, the film resistivity drops as the heat treatment temperature rises. Particularly, when the HCl content is 10 vol.% and the heat treatment temperature is 400° C., the film resistivity drops to about $10^{-2}$ Ω cm. This value is lower than the resistivity before the heat treatment by about 6 orders of magnitude. However, the film surface heated at the HCl content of 10 vol. % at 350° C. or higher was uneven and rough. It is believed that, by using a gas mixture of high HCl content at a high heat treatment temperature, the film surface is etched by or reacted with HCl. From X-ray diffraction, it is understood that the crystalline quality evaluated by the half width of the 112 diffraction peak of the chalcopyrite structure CIS film is considerably worse as compared with the film before the heat treatment. On the contrary, by heat treatment using gas having an HCl content of 5 vol. % or less, roughness of the film surface and the deterioration of crystalline quality were not observed regardless of the heat treatment temperature. It is understood from the figure that, when comparing the HCl contents of 5 vol. % and 1 vol. %, the resistivity drops at the same heat treatment temperature as the HCl content increases. Thereby, it is understood that, the film resistivity can be controlled by the heat a treatment temperature and the HCl content in the gas mixture. Though the above-mentioned embodiment shows the case of using N$_2$ as the dilution gas of HCl, the same results were obtained by using H$_2$, He, and Ar.

Figure 5:
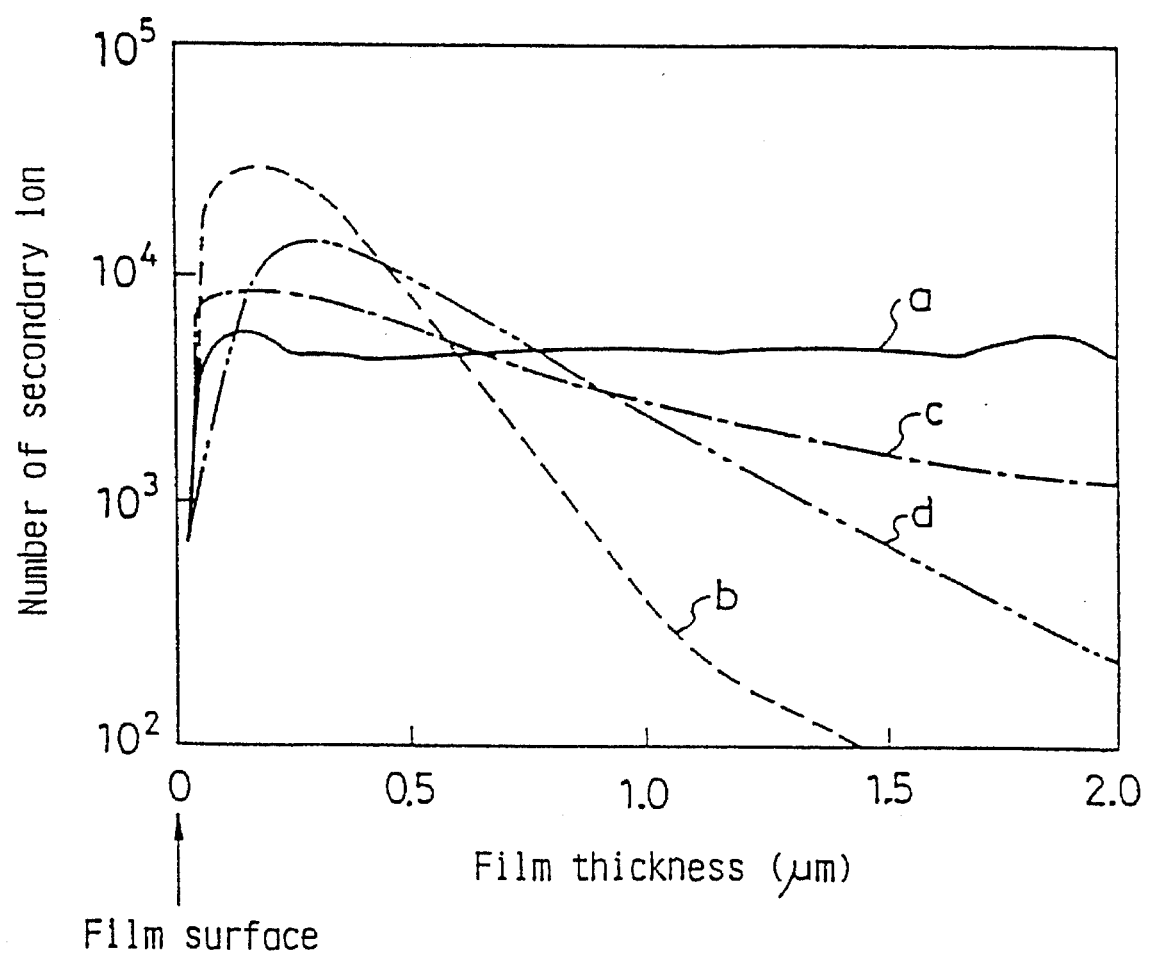
FIG. 5 shows distributions of Cl in CIS:Cl films obtained in embodiments 1 to 4.

FIG. 5 shows distributions of Cl in the CIS:Cl films produced in the aforementioned embodiments obtained by a secondary ion mass analysis. Curve "a" shows the Cl distribution of the CIS:Cl film produced by the simultaneous evaporating process, curve "b" shows that obtained by the vapor-phase diffusion process, and curve "c" shows that obtained by tile gas heat treatment process. Curve "d" is described later. The results shown were obtained (1) on films produced at a substrate temperature of 300° C. and an InCl$_3$ crucible temperature of 250° C. for the simultaneous evaporating process, (ii) on films heated at a substrate temperature of 300° C. and an InCl$_3$ crucible temperature of 250° C. for 30 minutes for the vapor-phase diffusion process, and (ill) on films heated at 300° C. in a gas mixture having an HCl content of 5 vol. % for the gas heat treatment process. It is understood that, in the simultaneous evaporating process, Cl is evenly distributed in the film. In the vapor-phase diffusion process and gas heat treatment process. Cl is distributed mostly near the film surface and decreases at depths approaching the substrate. When comparing the Cl distribution in the film in the vapor-phase diffusion process and gas heat treatment process, the latter is smaller. Thereby, the production process to be adopted can be selected according to the configuration or design of the devices to be produced.

Embodiment 4

Description will now be made of the result of heating the CIS:Cl films produced by the simultaneous evaporating process or vapor-phase diffusion process in an Ar atmosphere at 400° C. for 30 minutes. Hereinafter, this is referred to as "after heat treatment".

In the case of the simultaneous evaporating process, the films produced at a substrate temperature of 400° C. or higher have no change in resistivity before and after the after heat treatment. On the contrary, the resistivity of the films produced at a substrate temperature of 300° C. and an InCl$_3$ crucible temperature of 200° C. or higher is lower than those before the after heat treatment by one order of magnitude. It is believed that substitution takes place from dislocated Cl having entered between lattices to Se forming the crystal structure, and the amount of Cl supplying electrons has increased (increase in activation rate). In the film produced by the vapor-phase diffusion process, the resistivity of the film heated at the substrate temperature of 200° C. increased by the after heat treatment, and the resistivity of the film heated at 300° C. or higher decreased by about one order of magnitude. It is believed that, in the film heated at the substrate temperature of 200° C., Cl near the film surface diffuses into the film and is diluted by the after heat treatment. On the contrary, it is believed that, in the films produced at the substrate temperature of 300° C. or higher, though Cl near the film surface diffuses by the after heat treatment the activation factor increases to a greater extent. The curve "d" in FIG. 5 shows the Cl distribution of the film obtained by the vapor-phase diffusion process and heated at a substrate temperature of 300° C. and an InCl$_3$ crucible temperature of 250° C. for 30 minutes, after the heat treatment in the Ar atmosphere at 400° C. for 30 minutes. It is understood that Cl is distributed evenly in the film as compared with the film which is not subjected to the after heat treatment and shown by the broken line.

Although the chalcopyrite compound film is deposited by three-source evaporation in the above-mentioned embodiments, another preferable deposition method, for example, sputtering or selenization of Cu/In layers in H$_2$Se atmosphere may be employed in the present invention.

Additionally, the following is a brief explanation for the phrase "after heat treatment". The appropriate temperature for heat treatment is between 200° C. and 600 ° C. The heat treating time even at the lowest temperature is shorter than 5 hours. As the temperature increases, the treating time becomes shorter. As stated above, such after heat treatment will cause activation of the dopant or controlled distribution of the dopant.

Embodiment 5

A production process will be described for the fifth embodiment wherein a laminated film of a Group I element and a Group III element, or a thin film containing a Group I element and a Group III element is heated in an atmosphere containing a gaseous compound of the Group VIIA element and a vapor of a Group VI element. Hereinafter, this process is referred to as "solid-phase selenization process".

Figure 6:
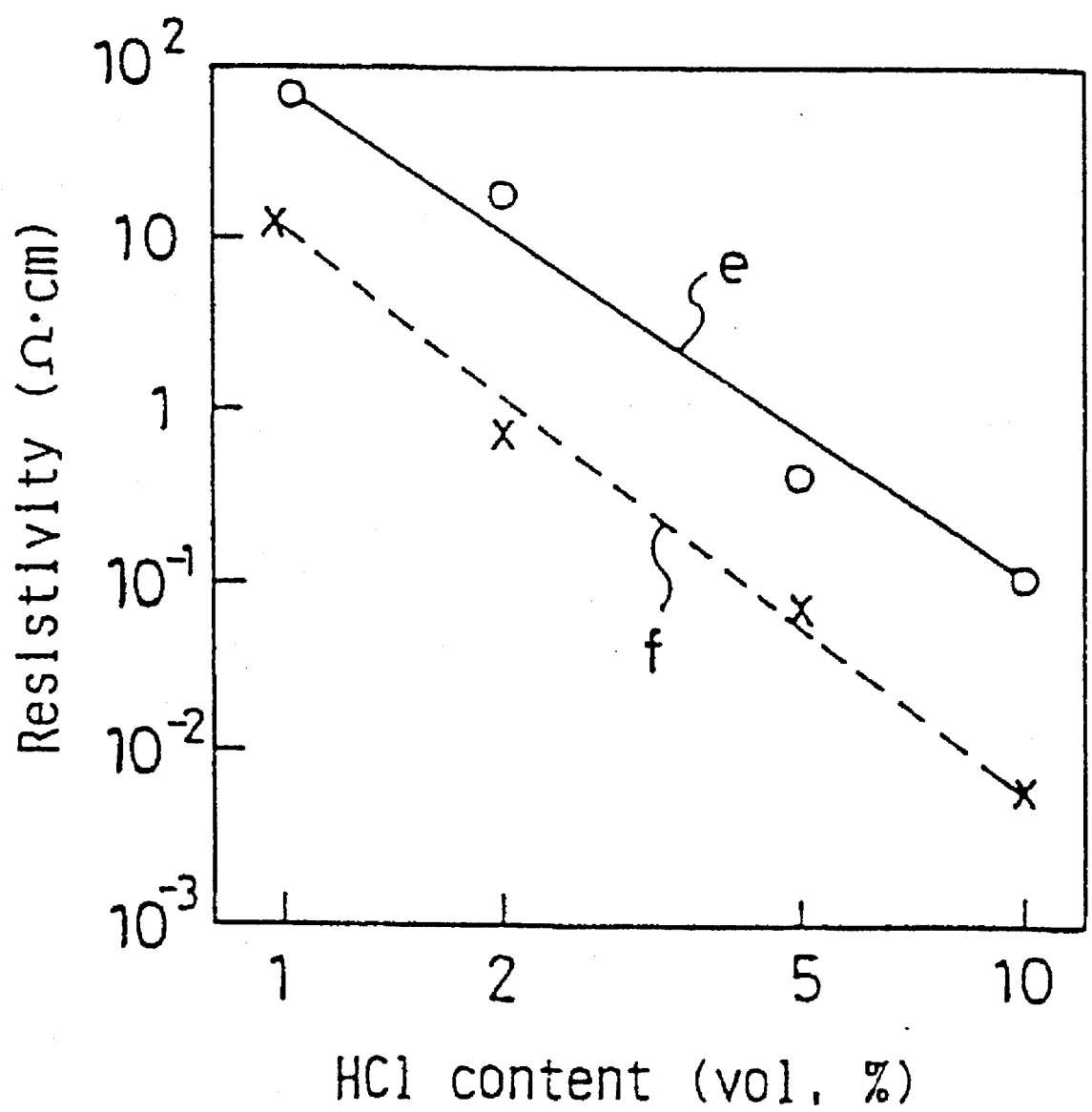
FIG. 6 shows the relationship between HCl content in the atmosphere at the time of obtaining the CIS:Cl film and resistivity of the resultant CIS:Cl films in embodiments 5 and 6.

First, a Cu film was deposited by sputtering on a glass substrate at a thickness of about 0.2 μm. Then, an In film was deposited on the Cu film by sputtering at a thickness of about 0.45 μm. The laminated film and Se powder are fed into a quartz tube, into which a mixture of HCl gas and $N_2$ gas Is introduced to produce a CIS film by heating with a heater provided around the quartz tube. The curve "e" in FIG. 6 shows the relationship between the HCl gas content in the gas mixture and the resistivity of the resultant CIS film. The heat treatment temperature is 450° C. and the time is 4 hours. The resistivity of the film decreases as the HCl gas content increases. It is believed that, as the heat treatment temperature rises, the amount of Cl taken into the film increases and the Cl in the film is activated. Thereby, it is understood that the resistivity can be controlled by the HCl gas content.

Embodiment 6

A production process, whereby a laminated film of a Group I element and a Group III element or a thin film containing a Group I element and a group III element is heated in an atmosphere containing a gaseous compound of the Group VI element and a gaseous compound of the Group VIIA element, is described. Hereinafter, this process is referred to as "vapor-phase selenization process".

First, Cu and In are deposited simultaneously on a glass substrate to produce a mixed Cu-In film or Cu-In alloy film. The composition ratio of Cu and In in the film is about 1:1. Then, the mixed film was fed into a quartz tube and heat treated in a mixture of HCl gas, $H_2Se$ gas, and $N_2$ gas to obtain a CIS film. Broken line curve "f" in FIG. 6 shows the relationship between the HCl gas content in the mixed gas and the resistivity of the resultant CIS film. The ratio of mixed gases except HCl gas is fixed at 10% $H_2Se$ and 90% $N_2$. The heat treatment temperature is 450° C. and the time is 4 hours. The film resistivity decreases as the HCl gas content increases. However, it is understood from an X-ray diffraction pattern that the resultant film does not form a chalcopyrite structure at an HCl gas content of 10% or more. It is believed that reaction between $H_2Se$ and the Cu-In film is suppressed as the HCl content increases. When comparing the solid-phase selenization process shown by the solid line curve "e" and the vapor-phase selenization process shown by the broken line curve "f", resistiveness of the resultant film at respective HCl gas contents are lower in the case of the vapor-phase selenization process, and the resistivity decreases abruptly as the HCl gas content increases. It is believed that, contrary to solid-phase reactions between a metal film and solid Se in the solid-phase selenization process, Cl in gaseous HCl is easily taken into the film, since the CIS film is formed by vapor-phase reactions between the metal film and $H_2Se$ in the vapor-phase selenization process.

Embodiment 7

Elucidation will now be made of the validity of the present invention on chalcopyrite structure semiconductor films other than the CIS film. As in embodiment 6, a mixed Cu-In film was fed into a quartz tube, into which a mixture of $H_2S$, HCl, and $N_2$ gases was introduced to produce $CuInS_2$ by heat treatment. The heat treatment is performed at 500° C. for 4 hours in the gas mixture having a fixed ratio of 10% $H_2S$ and 90% $N_2$ except HCl gas. When a $CuInS_2$:Cl film was produced by changing the HCl content from 1% to 10%, the resistivity of the resultant film changed from $10^2 \Omega$ cm to $10^2 \Omega$ cm. Thus, it is understood that the resistivity of the film can be controlled by changing the ItCl gas content. In this case, it is confirmed that a chalcopyrite structure is formed until the HCl gas content reaches 10%.

Embodiment 8

Evaporation source crucibles containing Cu, Al, Se, and CuCl were respectively heated at 1140° C., 1200° C., 200° C., and 400° C.; and a $CuAlSe_2$:Cl film was deposited on GaAs crystals having a (100) face at a substrate temperature of 600° C.. The resultant film was n-type and its resistivity was 1 Ω cm. Since the $CuAlSe_2$ film obtained without evaporating CuCl was p-type, it is understood that the conductivity type can be controlled by doping Cl. When this film was heat treated in an Ar atmosphere at 500° C. for 3 hours, the film resistivity dropped to $10^{-2} \Omega$ cm.

Embodiment 9

Figure 7:
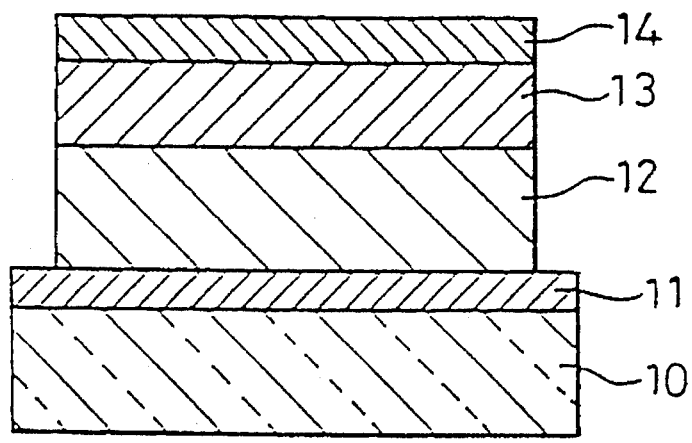
FIG. 7 is a longitudinal sectional view showing an example of the configuration of a solar cell device using a I-III-VI$_2$ film according to the present invention.

In the following, solar cells and light-emitting devices manufactured by using these processes will be described. FIG. 7 shows one embodiment of a solar cell manufactured by using the present invention.

Figure 8:
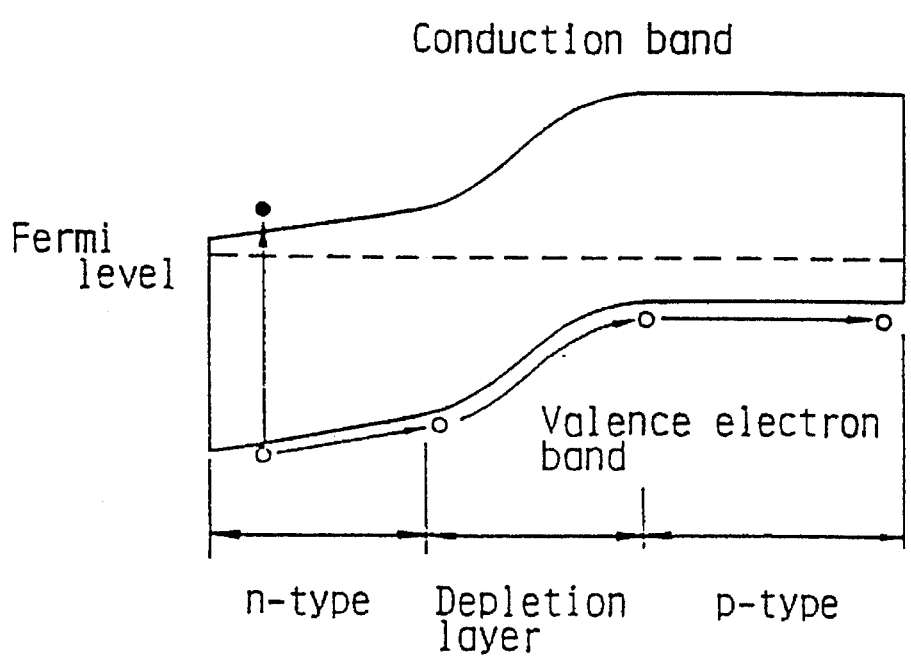
FIG. 8 shows the electronic band configuration of the device.

A p-type $CuInSe_2$ (CIS) thin film 12 is formed in a predetermined area on a Mo thin film 11 deposited on a glass substrate 10. For producing the p-type CIS film 12, a process of depositing a 2-layer CIS film having different composition ratios of Cu and In or a process of depositing the CIS film while irradiating with nitrogen ions are suitable. Next. In a vacuum of about $10^{-7}$ Torr, while fixing the substrate temperature of the p-type CIS film at about 300° C., evaporation of $InCl_3$ is carried out for substituting Se by Cl in the CIS film surface to form an n-type CIS:Cl film 13. Moreover, heat treatment is performed in an Ar or $N_2$ atmosphere at 300° C. for about 30 minutes. Optimum conditions of the heat treatment are dependent on the evaporation (, hence substitution) rate of $InCl_3$ and carrier concentration of the p-type CIS film. Therefore, the atmosphere gas and heat treatment temperature or time are suitably selected case-by-case. The heat treatment may sometimes not be necessary, depending on the carrier concentration or thickness of the p-type CIS film. On the p-n homojunction CIS film 13 formed by the above-mentioned process, a ZnO (ZnO:Al) film containing 1 wt. % Al is formed as a transparent electrode 14. FIG. 8 shows the electronic band structure of the device. In the n-type CIS film, as a result of diffusion of Cl from the CIS film surface, the surface is in an n-type low resistance structure, or a structure wherein the Fermi level is present near the conduction band of the CIS film and gradually approaches the valence electron band. In the case of such a band structure, since an internal electric field is produced also in the n-type CIS film, minority carriers (in this case, positive holes) produced near the film surface by luminous irradiation will be accelerated towards the depletion layer. In the case of a usual p-n junction, since the minority carriers near the film surface which are likely to recombine can also be outputted, the resultant current increases. Therefore, a high efficiency can be realized.

In another embodiment, an n-type CdS film was deposited by an evaporation method on a high resistance n-type CIS:Cl film formed next to a p-type CIS film surface having a reduced Cl doping amount, and a ZnO:Al film was deposited thereon to manufacture a solar cell. In this configuration, the internal electric field is produced gently in the whole high-resistance n-type CIS:Cl film disposed between the n-type CdS film and the p-type CIS film. Therefore, the carriers produced in the n-type CIS:Cl layer will be accelerated and outputted by the electrodes. By optimizing the film thickness of the CIS:Cl layer according to the optical absorption coefficient of the CIS film and carrier densities of the p-type CIS film and n-type CdS film, the carrier recombination can be reduced, and accordingly the carriers produced by luminous irradiation can be efficiently outputted. Thus a higher efficiency of the solar cell is achievable.

Embodiment 10

Figure 9:
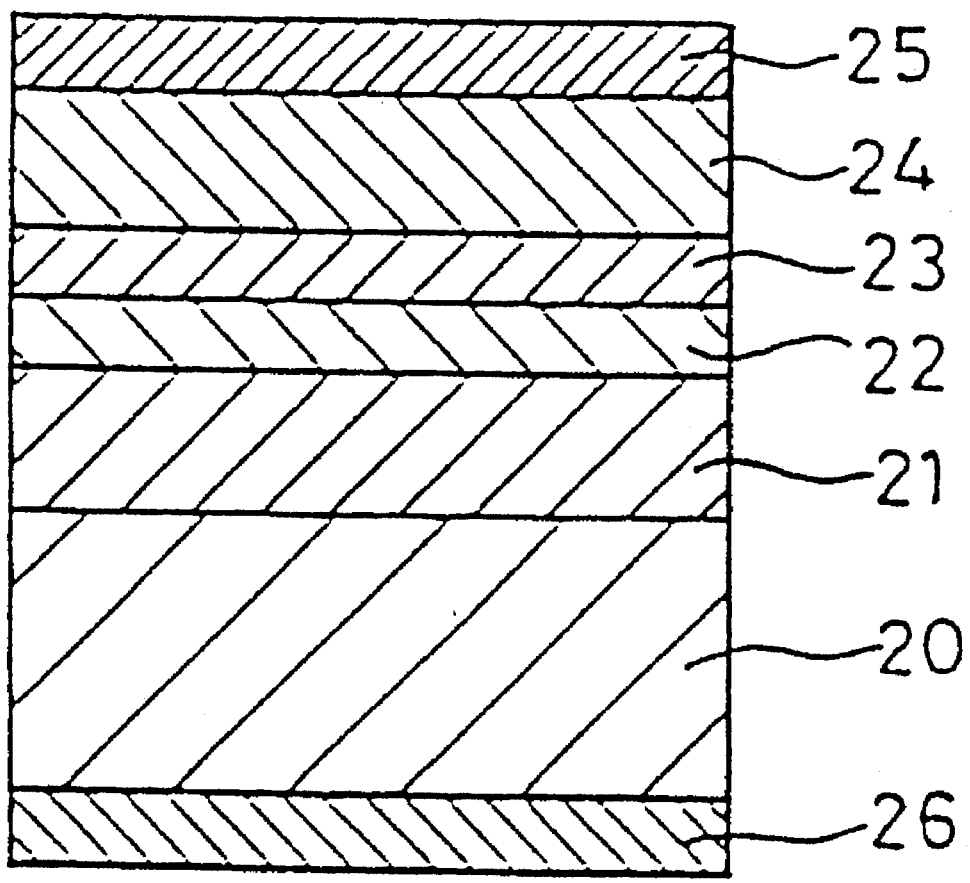
FIG. 9 is a longitudinal sectional view showing an example of the configuration of a light-emitting device using a I-III-VI$_2$ film according to the present invention.

FIG. 9 shows one embodiment of a visual range light-emitting device manufactured by using the present invention. A low resistance p-type $CuAlSe_2$ film 21 is formed on a GaAs substrate 20, and a high-resistance p-type $CuAlSe_2$ film 22 is formed thereon. Cu, Al, Se, and CuCl are evaporated simultaneously on the high-resistance p-type $CuAlSe_2$ film 22 to form a high-resistance n-type $CuAlSe_2$:Cl film 23. The evaporation rate of CuCl is increased to form a low-resistance n-type $CuAlSe_2$ film 24. Finally, electrodes 25, 26 consisting of Al or Au are provided. A blue light emission is obtained by injecting the carriers into the p-n Junction. At this time, since the carriers are injected from the low-resistance $CuAlSe_2$:Cl film 24, they can be injected efficiently. Thus, the luminous efficiency can be improved.

What is claimed is:

1. A solar cell device having as an absorber layer or heterojunction forming layer a chalcopyrite semiconductor film comprising a Group I-III-$VI_2$ chalcopyrite compound and a Group VIIA element as a dopant therein, wherein the Group VI element of the chalcopyrite compound is partly substituted by the Group VIIA element dopant and the dopant is present in an amount of about 0.1 atomic percent or less.

* * * * *